United States Patent
Lee

(10) Patent No.: US 10,497,864 B2
(45) Date of Patent: Dec. 3, 2019

(54) RESISTANCE CHANGE MEMORY DEVICES

(71) Applicant: SK hynix Inc., Icheon-si (KR)

(72) Inventor: Sanghun Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 8 days.

(21) Appl. No.: 15/986,968

(22) Filed: May 23, 2018

(65) Prior Publication Data

US 2018/0358551 A1    Dec. 13, 2018

(30) Foreign Application Priority Data

Jun. 8, 2017   (KR) .................. 10-2017-0071604

(51) Int. Cl.
*H01L 45/00*     (2006.01)
*H01L 27/24*     (2006.01)

(52) U.S. Cl.
CPC .......... *H01L 45/08* (2013.01); *H01L 45/1233* (2013.01); *H01L 45/1246* (2013.01); *H01L 45/1253* (2013.01); *H01L 45/1266* (2013.01); *H01L 45/146* (2013.01); *H01L 45/147* (2013.01); *H01L 45/149* (2013.01); *H01L 27/2463* (2013.01)

(58) Field of Classification Search
CPC . H01L 27/2463; H01L 27/2481; H01L 45/08; H01L 45/1233; H01L 45/1246; H01L 45/1253; H01L 45/1266; H01L 45/145; H01L 45/146; H01L 45/147; H01L 45/149

See application file for complete search history.

(56) References Cited

U.S. PATENT DOCUMENTS

| | | | |
|---|---|---|---|
| 8,772,750 B2 * | 7/2014 | Lee ..................... | G11C 13/0007 257/4 |
| 8,878,240 B2 * | 11/2014 | Moon .................... | H01L 45/08 257/1 |
| 9,029,192 B1 * | 5/2015 | Hsueh ................... | H01L 45/08 438/104 |
| 9,105,842 B2 | 8/2015 | Caimi et al. | |
| 9,240,550 B2 | 1/2016 | Dellmann et al. | |
| 9,484,087 B2 * | 11/2016 | Lee ..................... | G11C 11/5685 |
| 2005/0121697 A1 * | 6/2005 | Ishida ................ | G11C 13/0009 257/200 |
| 2008/0001137 A1 * | 1/2008 | Kozicki ................ | B82Y 10/00 257/4 |
| 2013/0043451 A1 * | 2/2013 | Lee ..................... | G11C 11/5685 257/2 |
| 2013/0149815 A1 * | 6/2013 | Murase .................. | H01L 45/08 438/104 |
| 2014/0170830 A1 * | 6/2014 | Lee ....................... | H01L 45/145 438/382 |
| 2018/0026183 A1 * | 1/2018 | Liu ....................... | H01L 45/08 257/4 |

OTHER PUBLICATIONS

"Oxygenated Amorphous Carbon for Resistive Memory Application", Santini et.al Nature Communications DOE: 10.1038/ncomms96001, Oct. 23, 2015.

* cited by examiner

*Primary Examiner* — Stephen W Smoot

(57) ABSTRACT

A resistance change memory element includes a lower electrode, a variable resistive layer disposed on the lower electrode and configured to include an oxygenated carbon structure, a barrier layer disposed on the variable resistive layer and configured to include an oxygen containable material that is able to be reversibly oxidized and reduced, and an upper electrode disposed on the barrier layer.

20 Claims, 10 Drawing Sheets

RESISTANCE CHANGE MEMORY DEVICES

CROSS-REFERENCE TO RELATED APPLICATIONS

The present application claims priority under 35 U.S.C 119(a) to Korean Application No. 10-2017-0071604, filed on Jun. 8, 2017, which is herein incorporated by references in its entirety.

BACKGROUND

1. Technical Field

The present disclosure generally relates to semiconductor devices, and more particularly, to resistance change memory devices including a resistance change material layer containing carbon.

2. Related Art

Generally, resistive memory devices may include a plurality of memory cells, and a resistance value of each resistive memory cell may vary according to a voltage or a current which is applied to the resistive memory cell. Information corresponding to the varied resistance value of the resistive memory cell may be regarded as a datum stored in the resistive memory cell. The resistive memory cells may retain their stored data even if their power supplies are interrupted. Thus, the resistive memory devices may correspond to nonvolatile memory devices. The resistive memory devices may include, for example, resistance change random access memory (RCRAM) devices (also, referred to as resistance change memory devices), phase change random access memory (PCRAM) devices and magnetic random access memory (MRAM) devices.

Each of memory cells of the RCRAM devices may include a variable resistive material. If a certain voltage is applied to both ends of the variable resistive material, conductive bridges and an interfacial insulation layer may be generated in the variable resistive material. Thus, the variable resistive material may have any one of two different resistance values according to a given voltage applied thereto. Because the conductive bridges and the interfacial insulation layer generated in the variable resistive material may be retained even after the given voltage is removed, the resistance value of the variable resistive material can correspond to a stored data value. Accordingly, the RCRAM devices may be used as nonvolatile memory devices.

SUMMARY

According to an embodiment, there is provided a resistance change memory element. The resistance change memory element includes a lower electrode, a variable resistive layer disposed on the lower electrode and configured to include an oxygenated carbon structure, a barrier layer disposed on the variable resistive layer and configured to include an oxygen containable material that can be reversibly oxidized and reduced, and an upper electrode disposed on the barrier layer.

According to an embodiment, there is provided a resistance change memory element. The resistance change memory element includes a lower electrode, a variable resistive layer disposed on the lower electrode and configured to include an oxygenated carbon structure, a barrier layer disposed on the variable resistive layer and configured to include an oxygen containable material that can be reversibly oxidized and reduced, and an upper electrode disposed on the barrier layer. The variable resistive layer is configured to control or alter a datum stored in the resistance change memory element based on formation or degradation of conductive bridges in the variable resistive layer.

DETAILED DESCRIPTION OF THE EMBODIMENTS

Figure 1:
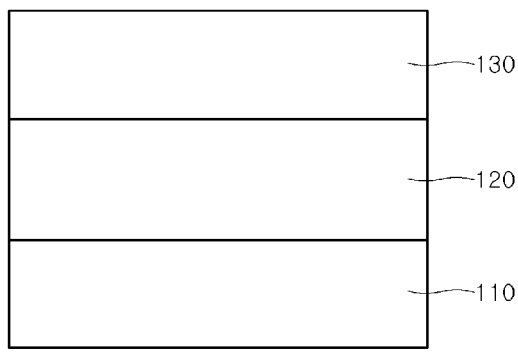
FIG. 1 is a cross-sectional view illustrating a resistance change memory element according to an embodiment of the present disclosure.

Various embodiments of the present disclosure will now be described more fully hereinafter with reference to the accompanying drawings. In the drawing figures, the dimensions (e.g., widths or thicknesses) of components (e.g., layers or regions) may be exaggerated for clarity of illustration. It will be understood that when an element is referred to as being "on" another element, it can be directly "on" the other element or intervening elements may also be present. In the drawings, like reference numerals refer to like elements throughout.

As used herein, the singular terms "a," "an" and "the" are intended to include the plural forms as well, unless the context clearly indicates otherwise. It will be understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

The following embodiments provide resistance change memory elements including a resistance change material layer containing carbon. According to the embodiments, an operation current may be effectively controlled to reversibly alter or change the resistance change memory elements between having a high resistive state and a low resistive state.

FIG. 1 is a cross-sectional view illustrating a resistance change memory element 1 according to an embodiment of the present disclosure. Referring to FIG. 1, the resistance change memory element 1 may include a lower electrode 110, an upper electrode 130, and a variable resistive layer 120 between the lower electrode 110 and the upper electrode 130. The variable resistive layer 120 is configured to control a datum stored in the resistance change memory element 1 based on formation or degradation of conductive bridges as described below. The variable resistive layer 120 may include an oxygenated carbon structure. The oxygenated carbon structure means carbon having a chemical structure with carbon-to-carbon bonds that allow oxygen to be physically or chemically bonded. That is, the oxygenated carbon structure may include carbon oxide material. The lower electrode 110 may include a conductive material. For example, the lower electrode 110 may include a platinum (Pt) material, a tungsten (W) material, a tantalum nitride (TaN) material, a titanium (TiN) nitride material, or a combination containing at least two of the above different materials.

In general, carbon may have $sp^2$-hybridized orbital bonds (hereinafter, referred to as '$sp^2$' bonds) or $sp^3$-hybridized orbital bonds (hereinafter, referred to as '$sp^3$' bonds) as carbon-to-carbon bonds. Therefore, the form of carbon may have one of two different electrical resistivity values depending on the form of the carbon-to-carbon bonds. For example, a carbon structure, material or layer may have a relatively low resistive state if the carbon has a first ratio of $sp^2$ bonds to $sp^3$ bonds, while the carbon structure, material or layer may have a relatively high resistive state if the carbon has a different, second ratio of $sp^2$ bonds to $sp^3$ bonds.

Similarly, the oxygenated carbon structure may also have one of two different resistivity values according to the form of the carbon-to-carbon bonds, i.e., $sp^2$ bonds and $sp^3$ bonds. For example, if the oxygen content of the oxygenated carbon structure is reduced, then the probability that the oxygenated carbon structure has a greater amount of $sp^2$ bonds as the carbon-to-carbon bonds increases. In contrast, if the oxygen content of the oxygenated carbon structure increases, then the probability that the oxygenated carbon structure has more $sp^3$ bonds as the carbon-to-carbon bonds increases.

Accordingly, if an oxygen content of the oxygenated carbon structure is reduced or lowered, then the oxygenated carbon structure may have a relatively reduced or low resistive state. In contrast, if an oxygen content of the oxygenated carbon structure increases, then the oxygenated carbon structure may have a relatively increased or high resistive state.

In an embodiment, a resistivity value of the oxygenated carbon structure may be reversibly changed by injecting or adding oxygen atoms into the oxygenated carbon structure or by removing oxygen atoms from the oxygenated carbon structure. For example, if the composition of the oxygenated carbon structure increases in the number of oxygen atoms combining with carbon, then the oxygenated carbon structure may have an increased number $sp^3$ bonds and may be reversibly converted to a high resistor. Alternatively, if the composition of the oxygenated carbon structure reduces in the number of oxygen atoms combining with carbon, then the oxygenated carbon structure may have an increased number of $sp^2$ bonds and may be reversibly altered to a low resistor.

Combining oxygen atoms with the oxygenated carbon structure, or removing oxygen atoms from the oxygenated carbon structure, may be achieved by applying different bias voltages to the variable resistive layer 120. In an embodiment, to a resistive change memory element 1 in an initial state, if a positive bias voltage is applied to the upper electrode 130, oxygen-to-carbon bonds in the variable resistive layer 120 may be broken to generate oxygen ions. The initial state of the resistance change memory element 1 may mean a state in which no bias voltage is applied to the variable resistive layer 120 after fabrication of the resistance change memory element 1. The oxygen ions generated in the variable resistive layer 120 may move toward the upper electrode 130 based on the application of the positive bias voltage. Subsequently, if a negative bias voltage is applied to the upper electrode 130, the oxygen ions are repelled from the upper electrode and may recombine with the oxygenated carbon structure of the variable resistive layer 120. That is, when the negative bias voltage is applied, the oxygen ions depart from the electrode and move into the variable resistive layer 120. In another embodiment, to the resistive change memory element 1 in the initial state, if a positive bias voltage is applied to the lower electrode 110, oxygen-to-carbon bonds in the variable resistive layer 120 may be broken to generate oxygen ions. The oxygen ions generated in the variable resistive layer 120 may move toward the lower electrode 110 based on the application of the positive bias voltage. Subsequently, if a negative bias voltage is applied to the lower electrode 110, the oxygen ions are repelled from the lower electrode 110 and may recombine with the oxygenated carbon structure of the variable resistive layer 120. As reflected in the above embodiments, in some circumstances, the resistance of the variable resistive layer 120 may be reversibly changed by applying positive or negative bias voltages to one of either the lower electrode 110 or the upper electrode 130.

Referring again to FIG. 1, the variable resistive layer 120 may include first oxygenated carbon structures comprised of $sp^2$ bonds and second oxygenated carbon structures comprised of $sp^3$ bonds. The first and second oxygenated carbon structures are distributed in the variable resistive layer 120 in a predetermined ratio. In an example, if a ratio of the second oxygenated carbon structures comprised of the $sp^3$ bonds to the first oxygenated carbon structures comprised of the $sp^2$ bonds increases, then the resistive state of the variable resistive layer 120 may be increased or be relatively high. In contrast, if a ratio of the first oxygenated carbon structures comprised of the $sp^2$ bonds to the second oxygenated carbon structures comprised of the $sp^3$ bonds increases, then the resistive state of the variable resistive layer 120 may be relatively low or decrease.

Electrical characteristics of general oxygenated carbon structures have been published in an article by Claudia A. Santini et al., entitled "*Oxygenated Amorphous Carbon for Resistive Memory Application*", Nature Communications DOE: 10.1038/ncomms96001, Oct. 23, 2015. Configurations of oxygenated carbon structures disclosed in the article may be applicable to the embodiments according to the present disclosure. The article is incorporated by reference herein in its entirety.

In an embodiment, the oxygenated carbon structures may be formed using a physical vapor deposition (PVD) technique utilizing a graphite target as a source target in an oxygen atmosphere. In such a case, the probability that the oxygenated carbon structures have the $sp^3$ bonds may be higher than the probability that the oxygenated carbon structures have the $sp^2$ bonds. Thus, the variable resistive layer 120 may be formed to have a relatively high resistive state in its initial state.

In another embodiment, the oxygenated carbon structures may be fabricated in a form of a graphite oxide material. For example, the oxygenated carbon structures may be formed by wet-oxidizing a graphite flake material. In such a case, the probability that the oxygenated carbon structures have the $sp^2$ bonds may be higher than the probability that the oxygenated carbon structures have the $sp^3$ bonds. Thus, the variable resistive layer 120 may be formed to have a relatively low resistive state in its initial state.

Referring still to FIG. 1, the upper electrode 130 may be disposed on a surface of the variable resistive layer 120 opposite to a surface interfacing with the lower electrode 110. The upper electrode 130 may include a conductive material. For example, the upper electrode 130 may include a platinum (Pt) material, a tungsten (W) material, a tantalum nitride (TaN) material, a titanium (TiN) nitride material, or a combination containing at least two different materials out of the above. In an embodiment, the upper electrode 130 and the lower electrode 110 may include the same material. Alternatively, the upper electrode 130 may include a material which is different from the lower electrode 110. In a further example, the upper electrode 130 may also exclude material found in lower electrode 110.

Figure 2:
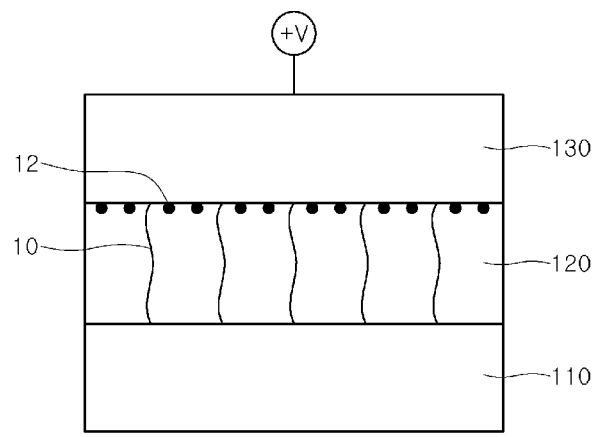
FIGS. 2 and 3 are cross-sectional views illustrating an operation of a resistance change memory element according to an embodiment of the present disclosure.
Figure 3:
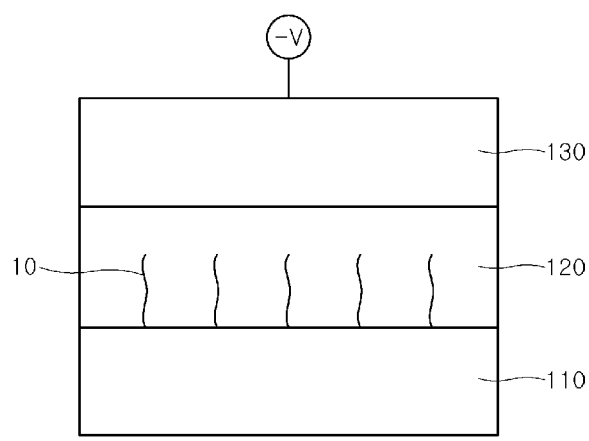

FIGS. 2 and 3 are cross-sectional views illustrating a method of operating the resistance change memory element 1 shown in FIG. 1. Referring to FIG. 2, in an embodiment, a first operation voltage having a positive polarity may be applied to the upper electrode 130. The lower electrode 110 may be grounded or a predetermined potential may be applied to the lower electrode 110.

If the positive bias voltage is applied to the upper electrode 130, oxygen-to-carbon bonds of the oxygenated carbon structure in the variable resistive layer 120 may be broken to generate oxygen ions 12. The oxygen ions 12 generated in the variable resistive layer 120 may move toward an interface between the variable resistive layer 120 and the upper electrode 130 consistent with the electric field created between the lower electrode 110 and the upper electrode 130. If the oxygen-to-carbon bonds in the variable resistive layer 120 are broken by the positive bias voltage applied to the upper electrode 130, then the carbon-to-carbon bonds of the oxygenated carbon structure in the variable resistive layer 120 may be changed into the $sp^2$ bonds having a relatively low resistive state. As a result, the resistive state of the oxygenated carbon structure and the variable resistive layer 120 may be decreased or may be relatively low.

The oxygenated carbon structures losing oxygen atoms may be arrayed or organized in the variable resistive layer 120 by the electric field created by the first operation voltage to form conductive bridges or filaments 10 between the lower electrode 110 and the upper electrode 130. That is, the oxygenated carbon structures with fewer oxygen atoms may be altered or modified to facilitate current paths between the lower electrode 110 and the upper electrode 130. As a result, the resistance change memory element 1 may act as a relatively low resistor. Even after the first operation voltage is removed from the upper electrode 130, the conductive bridges or filaments 10 can remain in the variable resistive layer 120. Therefore, the resistance change memory element 1 may be regarded as a memory element in which a datum corresponding to a relatively low resistive state is stored.

Referring to FIG. 3, a second operation voltage having a negative polarity may be applied to the upper electrode 130 and to a variable resistive layer 120 with a relatively low resistive state. The lower electrode 110 may be grounded or a predetermined potential may be applied to the lower electrode 110.

If the negative bias voltage is applied to the upper electrode 130, the oxygen ions (12 of FIG. 2) may recombine with the oxygenated carbon structures constituting the conductive bridges or filaments 10. That is, the oxygenated carbon structures constituting the conductive bridges 10 may be re-oxidized and change the previously reduced carbon-to-carbon $sp^2$ bonds of the oxygenated carbon structures into spa bonds. As a result, the oxygenated carbon structures of the variable resistive layer 120 may have a relatively high resistive state. This may be because at least a portion of the conductive bridges 10 is broken, degraded or decomposed by re-oxidation of the oxygenated carbon structures in the conductive bridges 10.

In an embodiment, if the negative bias voltage is applied to the upper electrode 130, the oxygen ions (12 of FIG. 2) distributed at the interface between the variable resistive layer 120 and the upper electrode 130 may be repelled and may easily recombine with the conductive bridges 10. Accordingly, portions of the conductive bridges 10 adjacent to the upper electrode 130 may be the first to disappear or degrade so as to partially remove or impede the current paths between the lower electrode 110 and the upper electrode 130. Thus, the resistance change memory element 1 may act as a relatively high resistor. Even after the second operation voltage is removed from the upper electrode 130, the damaged or shortened conductive bridges 10 may still exist or remain in the variable resistive layer 120. Therefore, the resistance change memory element 1 may be regarded as a memory element in which a datum corresponding to a relatively high resistive state can be stored.

Subsequently, although not shown in the drawings, a third operation voltage having a positive polarity may be applied to the upper electrode 130 of the resistance change memory element 1, which has previously been switched to a relatively high resistive state. At this time, the lower electrode 110 may be grounded or the predetermined potential may be applied to the lower electrode 110. In such a case, oxygen-to-carbon bonds of the oxygenated carbon structures in the variable resistive layer 120 may be broken to generate oxygen ions again, and the oxygenated carbon structures having the $sp^2$ bonds may be regenerated. The oxygenated carbon structures losing oxygen atoms may be bonded to ends of the damaged or shortened conductive bridges (10 of FIG. 3). Under the influence of the electric field created by the third operation voltage, the damaged or shortened conductive bridges (10 of FIG. 3) may grow, organize or re-form to electrically connect the lower electrode 110 to the upper electrode 130. As a result, the resistance change memory element 1 can be changed or switched back to the relatively low resistive state.

As described above, the resistance change memory element 1 according to an embodiment may reversibly react to a bias voltage to a relatively low resistive state or a relatively high resistive state. The resistance change memory element 1 may exhibit a relatively large operation current due to the conductive bridges 10 illustrated in FIG. 2 as compared with a resistance change memory element according to another embodiment which will be described hereinafter. The operation current means a current that flows through the resistance change memory element when the resistance change memory element has a relatively low resistive state. For example, the operation current may be within the range of approximately one (1) milliamperes (mA) to approximately ten (10) mA according to the structure of the resistance change memory element described above and with reference to FIGS. 1-3. If the operation current of the resistance change memory element increases, the power consumption of the resistance change memory element may also increase and the reliability of the resistance change memory element may be degraded. Accordingly, it is advantageous to reduce the operation current of the resistance change memory element in order to realize high performance or improve the performance of a resistance change memory element.

Figure 4:
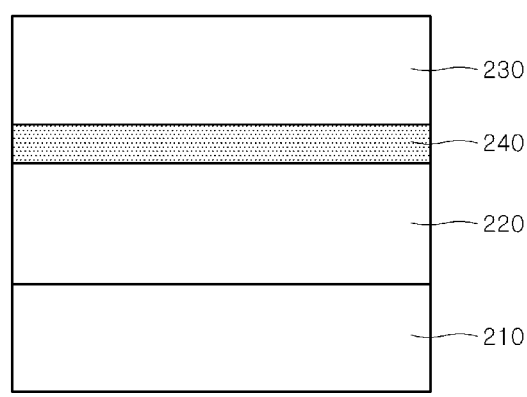
FIG. 4 is a cross-sectional view illustrating a resistance change memory element according to an embodiment of the present disclosure.

FIG. 4 is a cross-sectional view illustrating a resistance change memory element 2 according to another embodiment of the present disclosure. Referring to FIG. 4, the resistance change memory element 2 may include a lower electrode 210, a variable resistive layer 220, a barrier layer 240 and an upper electrode 230, which may be sequentially stacked. The variable resistive layer 220 is configured to control a datum stored in the resistance change memory element 2 based on formation or degradation of conductive bridges. The variable resistive layer 220 may include an oxygenated carbon structure. The barrier layer 240 may include an oxygen containable material that can be reversibly oxidized and reduced. An oxygen containable material is a material that can reversibly bond with oxygen or oxygen ions, or reversibly form an oxide in the presence of oxygen or oxygen ions.

The lower electrode 210 may include a conductive material. For example, the lower electrode 210 may include a platinum (Pt) material, a tungsten (W) material, a tantalum nitride (TaN) material, a titanium (TiN) nitride material, or a combination containing at least two of the different materials a.

The variable resistive layer 220 may include an oxygenated carbon structure. The variable resistive layer 220 may have substantially the same configuration as the variable resistive layer 120 described above and with reference to FIGS. 1-3. That is, the oxygenated carbon structure used in the variable resistive layer 220 may have one of two different electrical resistivity values depending on the form of carbon-to-carbon bonds. For example, the oxygenated carbon structure may have a relatively low resistive state if the oxygenated carbon structure has a first ratio of $sp^2$ bonds to $sp^3$ bonds, while the oxygenated carbon structure may have a relatively high resistive state if the oxygenated carbon structure has a different, second ratio of $sp^2$ bonds to $sp^3$ bonds.

In an embodiment, the variable resistive layer 220 may include first oxygenated carbon structures comprised of $sp^2$ bonds and second oxygenated carbon structures comprised of $sp^3$ bonds. The first and second oxygenated carbon structures are distributed in the variable resistive layer 220 in a predetermined ratio. In an example, if a ratio of the oxygenated carbon structures comprised of the $sp^3$ bonds to the oxygenated carbon structures comprised of the $sp^2$ bonds increases, then the resistive state of the variable resistive layer 220 may be increased or be relatively high. In contrast, if a ratio of the oxygenated carbon structures comprised of the $sp^2$ bonds to the oxygenated carbon structures comprised of the $sp^3$ bonds increases, then the resistive state of the variable resistive layer 220 may be relatively low or decrease.

The barrier layer 240 may be disposed between the variable resistive layer 220 and the upper electrode 230. In an embodiment, the barrier layer 240 may be disposed to be in contact with a surface of the variable resistive layer 220. The barrier layer 240 may include an oxygen containable material that can be reversibly oxidized and reduced. The oxygen containable material may be more readily oxidized, or react to oxygen more strongly, than the materials comprising lower electrode 210, i.e, the oxygen containable material is preferentially oxidized. When the oxygen containable material is oxidized, the electrical resistance of the oxygen containable material may increase. For example, the oxygen containable material used as the barrier layer 240 may include a hafnium (Hf) material, a titanium (Ti) material, a tantalum (Ta) material, an aluminum (Al) material, an alloy material of hafnium and titanium, an alloy material of tantalum and aluminum, an alloy material of titanium and tantalum, an alloy material of titanium and aluminum, an alloy material of hafnium and aluminum, an alloy material of tungsten and titanium, a tungsten silicide (WSi) material, a tantalum silicide (TaSi) material, a titanium silicide (TiSi) material, an N-type silicon material, or a combination containing at least two of the different materials above.

Figure 5:
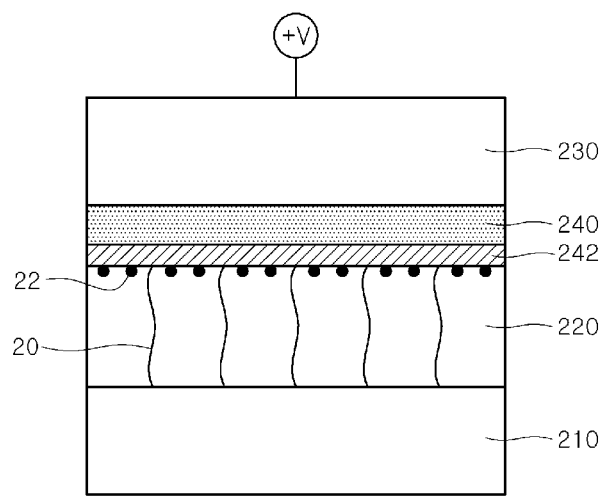
FIGS. 5 and 6 are cross-sectional views illustrating an operation of a resistance change memory element according to an embodiment of the present disclosure.
Figure 6:
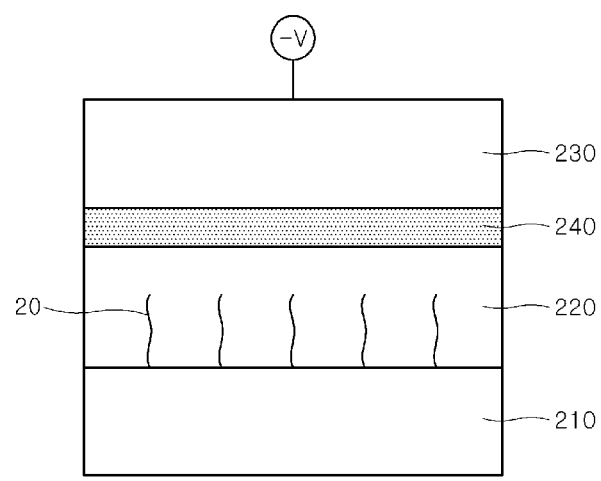

The oxygen containable material in the barrier layer 240 may react with oxygen ions in the variable resistive layer 220 or oxygen freed from carbon to oxygen bonds when a given bias voltage (for example, a positive bias voltage or a negative bias voltage) is applied to the upper electrode 230 (see FIGS. 5 and 6). For example, if the oxygen containable material in the barrier layer 240 reacts with oxygen ions, then the oxygen containable material may be oxidized and the electrical resistance of the oxygen containable material may increase. In contrast, if oxygen ions are detached from the oxygen containable material in the barrier layer 240, then the oxygen containable material may be reduced and the electrical resistance of the oxygen containable material may decrease.

The upper electrode 230 may be disposed on a surface of the barrier layer 240 opposite to a surface interfacing with the variable resistive layer 220. The upper electrode 230 may cover the barrier layer 240 and act as a capping layer of the barrier layer 240. The upper electrode 230 may exhibit a low reactivity with oxygen as compared to the barrier layer 240. For example, the upper electrode 230 may include a platinum (Pt) material, a tungsten (W) material, a tantalum nitride (TaN) material, a titanium (TiN) nitride material, or a combination containing at least two different materials above.

FIGS. 5 and 6 are cross-sectional views illustrating an operation of the resistance change memory element 2 shown in FIG. 4. Referring to FIG. 5, a first operation voltage having a positive polarity may be applied to the upper electrode 230. The lower electrode 210 may be grounded or a predetermined potential may be applied to the lower electrode 210.

If the positive bias voltage is applied to the upper electrode 230, oxygen-to-carbon bonds of the oxygenated carbon structure in the variable resistive layer 220 may be broken to generate oxygen ions 22. The oxygen ions 22 generated in the variable resistive layer 220 may move toward an interface between the variable resistive layer 220 and the barrier layer 240 in response to the electric field created between the lower electrode 210 and the upper electrode 230. The oxygen ions 22 reaching the barrier layer 240 may react with the oxygen containable material of the barrier layer 240. As a result, the oxygen containable material of the barrier layer 240 may be partially oxidized to form an interfacial oxide layer 242 at the interface between the variable resistive layer 220 and the barrier layer 240. The electrical resistance of the interfacial oxide layer 242 is higher than the resistance of the barrier layer 240. In an embodiment, the electrical resistance of the interfacial oxide layer 242 may be determined by oxygen reactivity of the barrier layer 240 and a thickness of the interfacial oxide layer 242. The thickness of interfacial oxide layer 242 may be controlled by a size of the positive bias voltage.

If the oxygen-to-carbon bonds in the variable resistive layer 220 are broken by the positive bias voltage (i.e., the first operation voltage) applied to the upper electrode 230, then the carbon-to-carbon bonds of the oxygenated carbon structures in the variable resistive layer 220 may be changed into the $sp^2$ bonds having a relatively low resistive state. As a result, the resistive state of the oxygenated carbon structures and the variable resistive layer 220 may be decreased or may be relatively low. The oxygenated carbon structures losing oxygen atoms may be arrayed or organized in the variable resistive layer 220 by the electric field created by the first operation voltage to form conductive bridges or filaments 20 between the lower electrode 210 and the barrier layer 240. That is, the oxygenated carbon structures losing oxygen atoms may be altered or modified to form current paths between the lower electrode 210 and the barrier layer 240. As a result, if the first operation voltage having a positive polarity is applied to the upper electrode 230, then the conductive bridges 20 may be formed in the variable resistive layer 220 so that the resistance change memory element 2 has a relatively low resistive state. In such a case, the interfacial oxide layer 242 having an increased resistance compared with that of the barrier layer 240 may efficiently reduce an operation current flowing through the resistance change memory element 2 having a relatively low resistive state.

As described above, when the resistance change memory element 2 has a relatively low resistive state, the operation current of the resistance change memory element 2 may be reduced due to the presence of the interfacial oxide layer 242 as compared to the embodiment described above and in connection with FIGS. 1-3. The operation current of the resistance change memory element 2 may be reduced or affected by the thickness and/or the resistivity of the interfacial oxide layer 242, while the storage of a datum corresponding to the relatively low resistive state is retained. The resistivity of the interfacial oxide layer 242 may be determined by the oxygen reactivity of the oxygen containable material in the barrier layer 240.

Referring to FIG. 6, a second operation voltage having a negative polarity may be applied to the upper electrode 230 and to the variable resistive layer 220 after the resistance change memory element 2 has been placed into a condition with a relatively low resistive state. The lower electrode 210 may be grounded or a predetermined potential may be applied to the lower electrode 210.

If the negative bias voltage is applied to the upper electrode 230, the oxygen atoms in the interfacial oxide layer 242 may be repelled from the oxygen containable material of the interfacial oxide layer 242 and change into oxygen ions. These oxygen ions may move into the variable resistive layer 220. Accordingly, the oxygen containable material of the interfacial oxide layer 242 may be reversibly altered or changed to be substantially incorporated into some portions of the barrier layer 240.

The oxygen ions may recombine with the carbon structures constituting the conductive bridges or filaments 20. That is, the oxygenated carbon structures constituting the conductive bridges 20 may be re-oxidized and change the previously reduced carbon-to-carbon $sp^2$ bonds of the carbon structures into $sp^3$ bonds. As a result, the oxygenated carbon structures of the variable resistive layer 220 may have a relatively high resistive state. This may be because at least a portion of the conductive bridges 20 is broken, degraded or decomposed by re-oxidation of the carbon structures in the conductive bridges 20.

In an embodiment, if the negative bias voltage is applied to the upper electrode 230, the oxygen ions generated in the interfacial oxide layer 242 may be repelled and may easily recombine with the conductive bridges 20. Accordingly, portions of the conductive bridges or filaments 20 adjacent to the barrier layer 240 may be the first to disappear or degrade so as to partially remove or impede the current paths between the lower electrode 210 and the barrier layer 240. Thus, the resistance change memory element 2 may act as a relatively high resistor. Even after the second operation voltage is removed from the upper electrode 230, the damaged or shortened conductive bridges 20 may still exist or remain in the variable resistive layer 220. Therefore, the resistance change memory element 2 may be regarded as a memory element in which a datum corresponding to a relatively high resistive state can be stored.

As described above, the resistance change memory element 2 according to the embodiment described above and in connection with FIGS. 4-6 may reversibly react to a bias voltage to switch between a relatively low resistive state or a relatively high resistive state. When the resistance change memory element 2 has a relatively low resistive state, the interfacial oxide layer 242 and the conductive bridges 20 may be formed in resistance change memory element 2. When the resistance change memory element 2 has a relatively high resistive state, at least a portion of the interfacial oxide layer 242 may be removed or returned to the barrier layer, and portions of the conductive bridges 20 may also be removed or degraded.

The interfacial oxide layer 242 having an increased resistance compared with that of the barrier layer 240 may efficiently reduce an operation current flowing through the conductive bridges 20 when the resistance change memory element 2 has a relatively low resistive state. Decrease of the operation current may be controlled or affected by the thickness and/or the resistivity of the interfacial oxide layer 242. The resistivity of the interfacial oxide layer 242 may be determined by the oxygen reactivity of the oxygen containable material in the barrier layer 240. As a result, the operation current of the resistance change memory element 2 according to the embodiment described above and in connection with FIGS. 4-6 may be smaller than the operation current of the resistance change memory element 1 according to the embodiment described above and in connection with FIGS. 1-3. Because the operation current of the resistance change memory element 2 having a relatively low resistive state can be controlled or countered using the interfacial oxide layer 242, the resistance change memory element 2 may exhibit low power consumption and improved reliability.

Figure 7A:
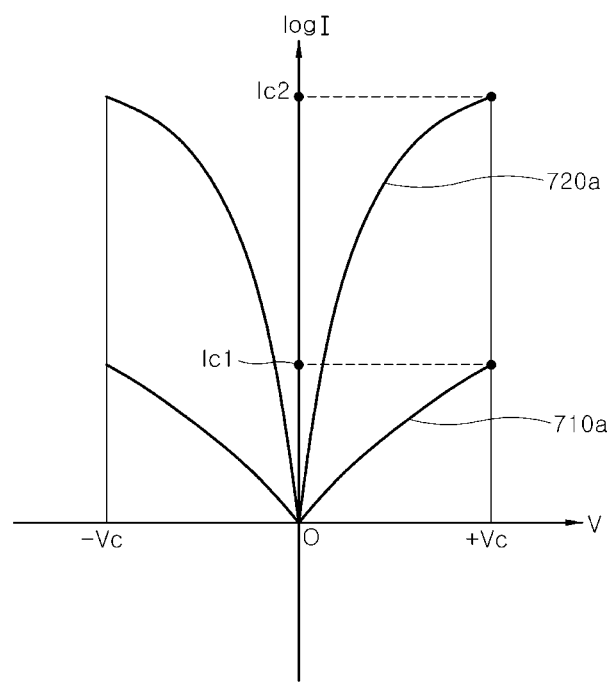
FIGS. 7A and 7B are graphs illustrating I-V characteristics of resistance change memory elements according to embodiments of the present disclosure.
Figure 7B:
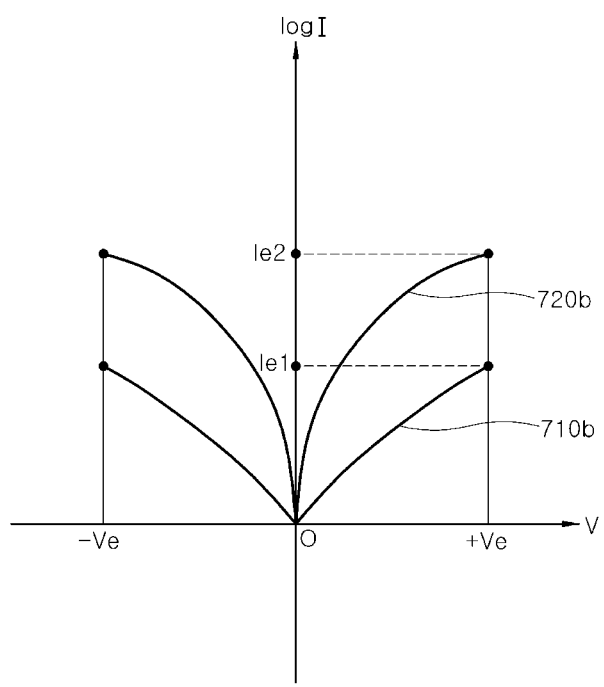

FIGS. 7A and 7B are graphs illustrating current versus voltage (I-V) characteristics of the resistance change memory elements 1 and 2 according to the embodiments described above and in connection with FIGS. 1-6. Specifically, FIG. 7A illustrates an I-V characteristic of the resistance change memory element 1 according to the embodiment described above and in connection with FIGS. 1-3, and FIG. 7B illustrates an I-V characteristic of the resistance change memory element 2 according to the embodiment described above and in connection with FIGS. 4-6. In the graphs of FIGS. 7A and 7B, the abscissas denote a voltage V applied to the upper electrodes 130 and 230 when the lower electrodes 110 and 210 are grounded, and the ordinates denote a log-scaled current log I flowing through the resistance change memory elements 1 and 2.

The I-V characteristics illustrated in FIGS. 7A and 7B may be obtained using the resistance change memory elements 1 and 2 that employ a titanium nitride (TiN) material as the lower and upper electrodes 110, 210, 130 and 230, and that employ a tantalum (Ta) material as the barrier layer 240. In addition, the I-V characteristics illustrated in FIGS. 7A and 7B may be obtained using the resistance change memory elements 1 and 2 that employ an oxygenated carbon structure as the variable resistive layers 120 and 220.

Referring to FIG. 7A, a first curve 710a shows an I-V characteristic of the resistance change memory element 1 having a relatively high resistive state, and a second curve 720a shows an I-V characteristic of the resistance change memory element 1 having a relatively low resistive state. The voltage V applied to the upper electrode 130 is controlled within the range of −Vc to +Vc. The voltage Vc means a set voltage. That is, if the set voltage Vc is applied to the upper electrode 130 of the resistance change memory element 1 having a relatively high resistive state, a current I flowing through the resistance change memory element 1 abruptly increases from a first operation current Ic1 to a second operation current Ic2 in which the resistance change memory element 1 has a relatively low resistive state. Referring to FIG. 7B, a first curve 710b shows an I-V characteristic of the resistance change memory element 2 having a relatively high resistive state, and a second curve 720b shows an I-V characteristic of the resistance change memory element 2 having a relatively low resistive state. The voltage V applied to the upper electrode 230 is controlled within the range of −Ve to +Ve. The voltage Ve means a set voltage. That is, if the set voltage Ve is applied to the upper electrode 230 of the resistance change memory element 2 having a relatively high resistive state, a current I flowing through the resistance change memory element 2 abruptly increases from a first operation current Ie1 to a second operation current Ie2 in which the resistance change memory element 2 has a relatively low resistive state. The second operation current Ie2 of the resistance change memory element 2 is smaller than the second operation current Ic2 of the resistance change memory element 1.

As described above, the second operation current Ie2 flowing through the resistance change memory element 2 having a relatively low resistive state may be smaller than the second operation current Ic2 flowing through the resistance change memory element 1 having a relatively low resistive state. Thus, an operation current of the resistance change memory element may be effectively reduced with the inclusion of a barrier layer.

Figure 8:
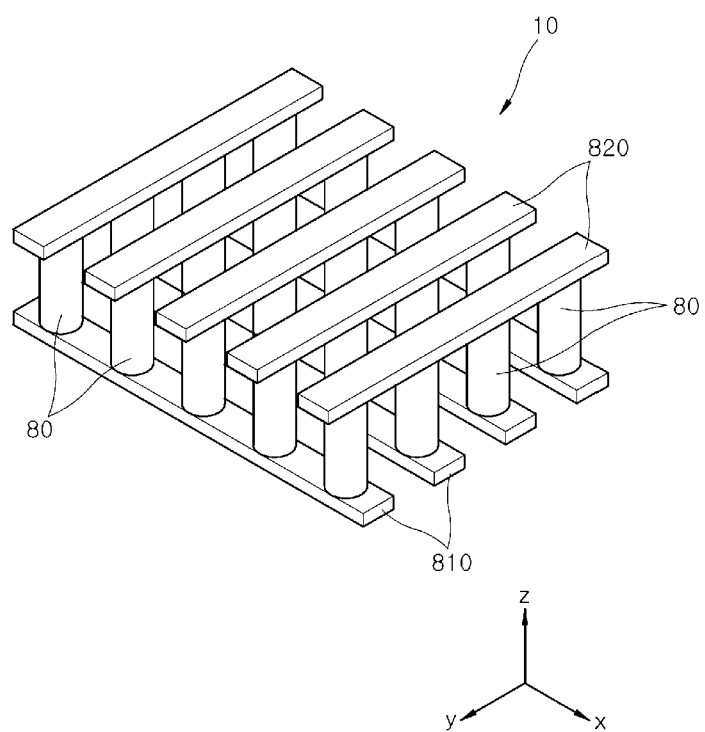
FIG. 8 is a perspective view illustrating a three-dimensional nonvolatile memory device according to an embodiment of the present disclosure.
Figure 9:
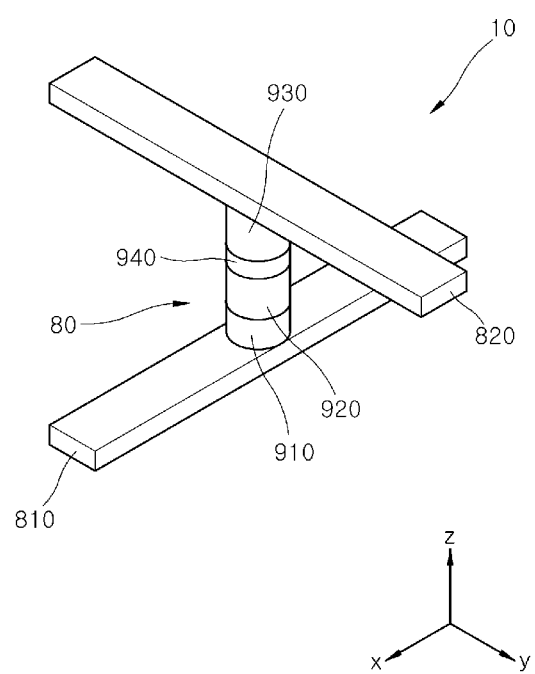
FIG. 9 is an enlarged view illustrating a portion of the three-dimensional nonvolatile memory device shown in FIG. 8.

The resistance change memory elements according to the embodiments may be applied to three-dimensional nonvolatile memory devices. FIG. 8 is a perspective view illustrating a three-dimensional nonvolatile memory device 10 employing any one of the resistance change memory elements 1 and 2 according to the embodiments. FIG. 9 is an enlarged view illustrating a portion of the three-dimensional nonvolatile memory device 10 shown in FIG. 8.

Referring to FIG. 8, the nonvolatile memory device 10 may include first conductive lines 810 arrayed to be parallel with an X-axis, second conductive lines 820 arrayed to be parallel with a Y-axis intersecting the X-axis, and pillar structures 80 respectively disposed at cross points of the first conductive lines 810 and the second conductive lines 820. Each of the pillar structures 80 may be disposed between one of the first conductive lines 810 and one of the second conductive lines 820 and may extend along a Z-axis. In each of FIGS. 8 and 9, the X-axis, the Y-axis and the Z-axis may be orthogonal to each other. However, the present disclosure is not limited thereto. For example, the X-axis and the Y-axis may intersect each other at different non-right angles. The pillar structures 80 may be arrayed in a matrix form along the X-axis and the Y-axis to provide an array of pillar structures. Each of the pillar structures 80 may act as any one of memory cells of the nonvolatile memory device 10.

Referring to FIG. 9, the pillar structure 80 may include a lower electrode 910, a variable resistive layer 920, a barrier layer 940 and an upper electrode 930 which are sequentially stacked on a portion of the first conductive line 810. The pillar structure 80 may have substantially the same configuration as the resistance change memory element 2 illustrated in FIGS. 4, 5 and 6. That is, the lower electrode 910, the variable resistive layer 920, the barrier layer 940 and the upper electrode 930 may correspond to the lower electrode 210, the variable resistive layer 220, the barrier layer 240 and the upper electrode 230, respectively.

As described above, a resistive state of the pillar structure 80 may be determined according to oxidation or reduction of an oxygen containable material in the barrier layer 940 and according to generation of conductive bridges in the variable resistive layer 920 while a voltage is applied between the first conductive line 810 and the second conductive line 820.

According to the above embodiment, if the variable resistive layer 920 includes oxygenated carbon structures, the barrier layer 940 may prevent an operation current of the pillar structure 80 from excessively flowing when the pillar structure 80 has a relatively low resistive state. As a result, low power and highly reliable nonvolatile memory devices may be realized.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A resistance change memory element comprising:
   a lower electrode;
   a variable resistive layer disposed on the lower electrode and configured to include an oxygenated carbon structure;
   a barrier layer disposed on the variable resistive layer and configured to include an oxygen containable material that is able to be reversibly oxidized and reduced; and
   an upper electrode disposed on the barrier layer.

2. The resistance change memory element of claim 1, wherein the variable resistive layer and the barrier layer are disposed to provide an interface therebetween.

3. The resistance change memory element of claim 1,
   wherein the oxygenated carbon structure comprises carbon-to-carbon bonds;
   wherein a resistivity value of the oxygenated carbon structure is determined according to the hybridization of carbon-to-carbon bonds; and
   wherein the oxygenated carbon structure has at least one of $sp^2$ hybridized bonds and $sp^3$ hybridized bonds as the carbon-to-carbon bonds.

4. The resistance change memory element of claim 1,
   wherein the oxygenated carbon structure comprises oxygen-to-carbon bonds;

wherein the oxygen-to-carbon bonds are broken by a bias voltage applied to the upper electrode to generate oxygen ions.

5. The resistance change memory element of claim 1, further comprising:
conductive bridges disposed in the variable resistive layer to connect the lower electrode to the barrier layer; and
an interfacial oxide layer between the barrier layer and the variable resistive layer,
wherein an electrical resistance of the interfacial oxide layer is higher than an electrical resistance of the barrier layer.

6. The resistance change memory element of claim 5, wherein the interfacial oxide layer reduces an amount of a current flowing through the conductive bridges when a bias voltage is applied between the lower electrode and the upper electrode.

7. The resistance change memory element of claim 6, wherein the conductive bridges are formed by reduction oxygen-to-carbon bonds of the oxygenated carbon structure.

8. The resistance change memory element of claim 1, further comprising conductive bridges formed in the variable resistive layer,
wherein the conductive bridges are degraded to increase a resistance value between the lower electrode and the upper electrode when a predetermined voltage is applied to the upper electrode.

9. The resistance change memory element of claim 1, wherein the oxygen containable material is preferentially oxidized compared to the lower electrode.

10. The resistance change memory element of claim 9, wherein the oxygen containable material includes at least one of a hafnium (Hf) material, a titanium (Ti) material, a tantalum (Ta) material, an aluminum (Al) material, an alloy material of hafnium and titanium, an alloy material of tantalum and aluminum, an alloy material of titanium and tantalum, an alloy material of titanium and aluminum, an alloy material of hafnium and aluminum, an alloy material of tungsten and titanium, a tungsten silicide (WSi) material, a tantalum silicide (TaSi) material, a titanium silicide (TiSi) material and an N-type silicon material.

11. The resistance change memory element of claim 9, wherein the lower electrode includes at least one of a platinum (Pt) material, a tungsten (W) material, a tantalum nitride (TaN) material and a titanium (TiN) nitride material.

12. The resistance change memory element of claim 1, wherein the upper electrode includes at least one of a platinum (Pt) material, a tungsten (W) material, a tantalum nitride (TaN) material and a titanium (TiN) nitride material.

13. A resistance change memory element comprising:
a lower electrode;
a variable resistive layer disposed on the lower electrode and configured to include an oxygenated carbon structure;
a barrier layer disposed on the variable resistive layer and configured to include an oxygen containable material that is able to be reversibly oxidized and reduced; and
an upper electrode disposed on the barrier layer,
wherein the variable resistive layer is configured to control a datum stored in the resistance change memory element based on formation or degradation of conductive bridges generated in the variable resistive layer.

14. The resistance change memory element of claim 13, wherein the oxygenated carbon structure comprises carbon-to-carbon bonds;
wherein a resistivity value of the oxygenated carbon structure is determined according to the hybridization of carbon-to-carbon bonds; and
wherein the oxygenated carbon structure has at least one of $sp^2$ hybridized bonds and spa hybridized bonds as the carbon-to-carbon bonds.

15. The resistance change memory element of claim 14, wherein the oxygenated carbon structure comprises oxygen-to-carbon bonds; and
wherein the conductive bridges are provided by reduction of the oxygen-to-carbon bonds in oxygenated carbon structure.

16. The resistance change memory element of claim 13, further comprising an interfacial oxide layer formed between the barrier layer and the variable resistive layer when a positive bias voltage is applied to the upper electrode,
wherein an electrical resistance of the interfacial oxide layer is higher than an electrical resistance of the barrier layer.

17. The resistance change memory element of claim 13, wherein oxygen-to-carbon bonds of the oxygenated carbon structure are broken by a bias voltage applied to the upper electrode to generate oxygen ions.

18. The resistance change memory element of claim 13, wherein the oxygen containable material includes at least one of a hafnium (Hf) material, a titanium (Ti) material, a tantalum (Ta) material, an aluminum (Al) material, an alloy material of hafnium and titanium, an alloy material of tantalum and aluminum, an alloy material of titanium and tantalum, an alloy material of titanium and aluminum, an alloy material of hafnium and aluminum, an alloy material of tungsten and titanium, a tungsten silicide (WSi) material, a tantalum silicide (TaSi) material, a titanium silicide (TiSi) material and an N-type silicon material.

19. The resistance change memory element of claim 13, wherein the lower electrode includes at least one of a platinum (Pt) material, a tungsten (W) material, a tantalum nitride (TaN) material and a titanium (TiN) nitride material.

20. The resistance change memory element of claim 13, wherein the resistance change memory element has a relatively low resistive state when the conductive bridges are formed by a positive voltage applied to the upper electrode; and
wherein the resistance change memory element has a relatively high resistive state when portions of the conductive bridges are removed by a negative voltage applied to the upper electrode.

* * * * *